United States Patent [19]
Madland et al.

[11] 3,986,044
[45] Oct. 12, 1976

[54] CLOCKED IGFET VOLTAGE LEVEL SUSTAINING CIRCUIT

[75] Inventors: Paul Dale Madland; M. Clair Webb, both of Tempe, Ariz.

[73] Assignee: Motorola, Inc., Chicago, Ill.

[22] Filed: Sept. 12, 1975

[21] Appl. No.: 612,996

[52] U.S. Cl. .................... 307/205; 307/214; 307/270; 307/DIG. 4
[51] Int. Cl.² ............... H03K 19/08; H03K 19/40
[58] Field of Search ...... 307/205, 214, 270, DIG. 4; 328/176

[56] References Cited
UNITED STATES PATENTS

| | | | |
|---|---|---|---|
| 3,480,796 | 11/1969 | Polkinghorn et al. | 307/DIG. 4 |
| 3,619,670 | 11/1971 | Heimbigner | 307/251 X |
| 3,710,271 | 1/1973 | Putman | 307/205 X |
| 3,769,528 | 10/1973 | Chu et al. | 307/270 |
| 3,778,784 | 12/1973 | Karp et al. | 307/DIG. 4 |
| 3,906,464 | 9/1975 | Lattin | 340/173 R |

OTHER PUBLICATIONS
De Simone, "Dynamic Gating Circuit"; IBM Tech. Discl. Bull.; vol. 18, No. 3; pp. 638–639; 8/1975.

Primary Examiner—John S. Heyman
Assistant Examiner—Larry N. Anagnos
Attorney, Agent, or Firm—Harry M. Weiss; Charles R. Hoffman

[57] ABSTRACT

A voltage level sustaining circuit for an IGFET driver circuit having an output node includes a first IGFET coupled between a voltage supply conductor and an output node of a driver circuit. The gate of the first IGFET is coupled to a source of a second IGFET having its gate and drain connected to the voltage supply conductor. A boosting capacitor is connected between the gate of the first IGFET and a conductor to which a refresh pulse is applied. The refresh pulse need be applied only often enough and be of sufficient magnitude to turn on the first IGFET sufficiently hard that the output node is held at the voltage of the voltage supply conductor.

1 Claim, 1 Drawing Figure

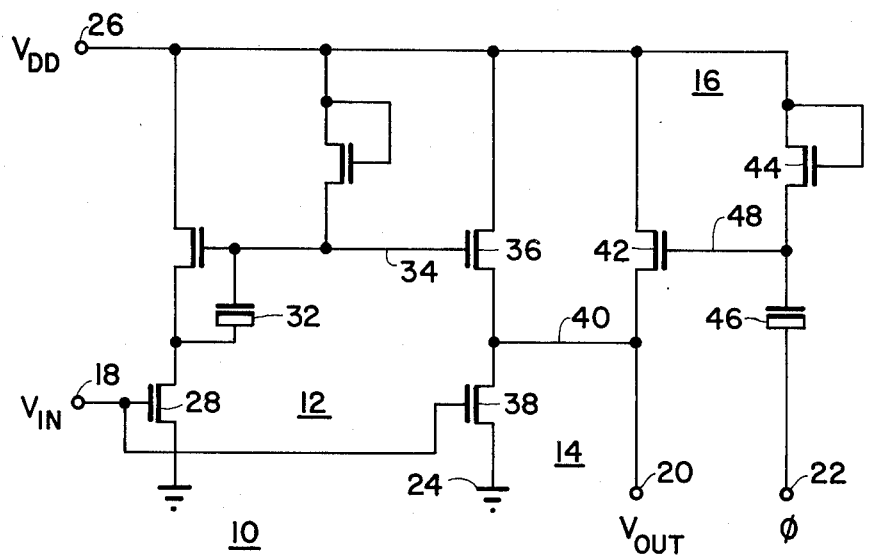

CLOCKED IGFET VOLTAGE LEVEL SUSTAINING CIRCUIT

BACKGROUND OF THE INVENTION

1. Field of the Invention

The invention relates to IGFET (insulated gate field effect transistor) circuits and particularly to resistive devices and circuits for holding a capacitive node substantially at a voltage supply level.

2. Brief Description of the Prior Art

Typical logic circuits, such as logic gates or inverters and other circuits implemented using IGFETs have switch devices, which are IGFETs connected to a "ground" voltage supply and having their gate electrodes connected to inputs of the logic gate or inverter thereby implemented. Such logic circuits also usually include a load IGFET having its drain connected to a voltage supply conductor or clock conductor and its source connected to the drain of the one or more switch IGFETS. The gate of the load IGFET may be connected to its drain, or it may be connected to a clock conductor. The clock signal may be generated externally, or may be generated on an integrated circuit chip with the subject logic circuit. For dynamic IGFET circuits, the output node is charged up to a logical "1" level, but after the clock pulse or signal causing such charging disappears, the voltage level of the output is sustained by virtue of charge stored on capacitance associated with the output node. Usually there are parasitic leakage current paths which will cause a gradual discharge of the output voltage if the clock pulse does not reappear and charge the voltage to a full logical 1 level. Diffused resistors connected between the output node and a supply voltage conductor have been utilized as level sustaining devices. Also, in silicon gate IGFET circuits, polycrystalline silicon resistors have been utilized. However, such resistors normally need to be of very high resistance in order to reduce power consumption. Consequently, the amount of chip area required by such resistors is very large. Further, such resistors cause additional capacitive loading on the output node, which undesireably reduces switching speed.

SUMMARY OF THE INVENTION

It is an object of this invention to provide a clocked level sustaining circuit which dissipates no DC power and which requires less semiconductor chip area for implementation than level sustaining devices of the prior art.

Briefly described, the invention is a voltage level sustaining circuit including a first electron control device having a first electrode, a second electrode, and a control electrode. The first electrode is coupled to a supply voltage conductor and a second electrode is coupled to a first node. A second electron control device is connected between the first node and a supply voltage conductor. A boosting capacitor is also coupled between the first control electrode and a signal conductor adapted for having a periodic pulse applied thereto of sufficient magnitude to cause the first electron control device to switch from an off condition into a resistive condition to provide a resistive connection between the node and the supply voltage conductor.

BRIEF DESCRIPTION OF THE DRAWINGS

The sole FIGURE is a circuit schematic diagram of a presently preferred embodiment of the invention.

DESCRIPTION OF THE INVENTION

Referring to the sole FIGURE, driver circuit 10 includes a conventional IGFET bootstrap inverter 12 coupled to a push-pull driver circuit 14. Output node 20 of driver circuit 14 has a clocked voltage level sustaining circuit 16 coupled thereto.

Bootstrap circuit 12 includes a load MOSFET 30 coupled between $V_{DD}$ conductor 26 and node 33 and has it gate connected to node 34. Bootstrap capacitor 32 is connected between node 28 and node 34. Switch MOSFET 28 is connected between ground conductor 24 and node 33 and has its gate connected to input conductor 18 to which an input signal $V_{in}$ may be applied. IGFET 35 has its gate and drain connected to $V_{DD}$ and its source connected to node 34 and acts to charge bootstrap capacitor when MOSFET 28 is on in response to a logical 1 level being applied to input conductor 18. When a logical "0" is applied to input conductor 18, MOSFET 28 is off, and the voltage at node 34 is boosted to approximately $2V_{DD}-V_{TH}$ volts, where $V_{TH}$ is the threshold voltage of IGFET 35. Driver circuit 14 includes IGFET 36 having its drain connected to $V_{DD}$, its gate connected to node 34, and its source connected to output node 20. MOSFET 36 is a load device or a pull up device of the push-pull buffer circuit 14. Switch MOSFET 38 has its drain connected to node 20, its source connected to node 24, and its gate connected to input node 18.

The operation of the circuit including bootstrap inverter 12 and push-pull driver circuit 14 is well-known. If a logical 1 is applied at node 18, MOSFETs 28 and 38 are on. Node 33 is thus held at ground. Node 34 is held at $V_{DD}-V_{TH}$ volts, which is also equal to the voltage across bootstrap capacitor 32. MOSFET 36 is on, but is overpowered by MOSFET 38, which has a much lower impedance by virtue of the design of its geometry channel width to channel length ratio. When the voltage on node 18, $V_{in}$, goes from a logical 1 to a logical 0, MOSFETs 28 and 38 are turned off, and node 33 beings to rise. Bootstrap capacitor 32 tries to maintain a constant voltage, so that node 34 rises, turning on MOSFET 36 much harder. $V_{out}$out then goes all the way to $V_{DD}$ volts. It should be noted that when node 34 rises, MOSFET 35 is turned off, and the voltage on node 34 is maintained by the virtue of the voltage stored on the capacitance associated with node 34. In a practical integrated circuit embodiment of the invention, there is a possibility of leakage paths existing which would discharge the voltage on node 34 even though $V_{in}$ remains at a logical 0 for a long period of time. If this happened, node 34 could be slowly discharged to $V_{DD}-V_{TH}$ volts. Then $V_{OUT}$ would fall from $V_{DD}$ volts to $V_{DD}-2V_{TH}$ volts, which might be inacceptable if a circuit driven by $V_{out}$ (not shown) is not designed to accept such a low logical 1 voltage level. A conventional way of maintaining $V_{out}$ at $V_{DD}$ volts is to provide a polycrystalline silicon resistor between node 20 and $V_{DD}$ for a silicon gate implementation of the circuit. However, as previously explained, this approach takes a great deal of chip area of the semiconductor chip, since a very high value of resistance would be required for such a pull up resistor.

According to the invention, level sustaining circuit 16 is connected to node 20 and includes IGFET 42 having its drain connected to $V_{DD}$, it source connected to node 20, and its gate connected to node 48. MOSFET 44 has its gate and drain connected to $V_{DD}$, its source connected to node 48. Capacitor 46 has one electrode connected to node 48 and the other electrode connected to clock conductor 22, to which any suitable, relatively repetitive signal $\phi$ may be applied. $\phi$, of course, may be an externally supplied clock signal or an internally generated signal. The only requirement is that it have sufficient voltage magnitude to boost node 48 to a sufficiently high level to turn on IGFET 42 into its so-called linear or triode region, as opposed to its saturation region, so that a truly resistive path exists between $V_{DD}$ and node 20.

Those skilled in the art will recognize that MOSFETs (metal oxide semiconductor field effect transistors), as implemented in typical integrated circuits, are bilateral devices, having a gate and a source and a drain. However, the source and drain are functionally interchangeable, and both in the description and in the claims herein the terms are utilized merely to indicate interconnections, rather than function of a particular MOSFET terminal. For example, a particular terminal of a MOSFET which functions as a drain for one part of the circuit operation may function as a source for another part of the circuit operation. For a more complete description of the operation and physics of MOSFETs, see "Physics and Technology of Semiconductor Devices," by A. S. Grove, John Wiley & Sons, Inc., 1967. Those skilled in the art will also recognize that the acronym MOSFET is commonly used synonymously with the term IGFET (insulated gate field effect transistor), even though the gate may be polycrystalline silicon or some other conductive material rather than metal.

It is also necessary that the signal $\phi$ be sufficiently repetitive to turn on MOSFET 42 often enough to boost node 20 often enough to compensate for any parasitic leakage current from node 20 which might tend to degrade the voltage level capacitively stored on node 20 (when MOSFET 38 in off condition).

The advantages of the invention in terms of semiconductor chip area savings are substantial. In one embodiment, a 100 kilohm polycrystalline silicon pull up resistor would have been required which would have occupied 600 square mills of chip area. The level sustaining circuit 16 was found to be capable of accomplishing the same function utilizing only 15 to 25 square mills of chip area. It was found that it was only necessary to apply pulse $\phi$ every two miliseconds to achieve a suitable $V_{DD}$ voltage level at output node 20. Exemplary values of the circuit elements in circuit 16 are 0.5 picofarads for capacitor 46, a channel width of 10 microns and a channel length of 8 microns, for MOSFET 44, and a channel width of 8 microns and a channel length of 50 microns, for MOSFET 42.

What is claimed is:

1. An IGFET voltage level sustaining circuit comprising;

a load IGFET having its drain coupled to supply voltage conductor means and its source connected to a first node and its gate connected to control circuit means;

a switch MOSFET having its drain connected to said first node and it source coupled to second voltage supply conductor means and its gate coupled to said control circuit means;

a first MOSFET having its drain connected to said voltage supply conductor means and its source connected to said first node and its gate connected to a second node;

boosting capacitor means coupled between said second node and a boosting signal conductor;

a charging IGFET having its source coupled to said second node and its gate and drain coupled to said voltage supply conductor means.

* * * * *